(12) United States Patent
Shin

(10) Patent No.: US 10,026,501 B2
(45) Date of Patent: Jul. 17, 2018

(54) DATA STORAGE DEVICE AND OPERATING METHOD THEREOF

(71) Applicant: SK hynix Inc., Gyeonggi-do (KR)

(72) Inventor: Dae Seok Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 33 days.

(21) Appl. No.: 15/178,033

(22) Filed: Jun. 9, 2016

(65) Prior Publication Data

US 2017/0221583 A1    Aug. 3, 2017

(30) Foreign Application Priority Data

Feb. 2, 2016 (KR) .................. 10-2016-0013003

(51) Int. Cl.
*G11C 29/56* (2006.01)
*G11C 29/38* (2006.01)
*G11C 29/12* (2006.01)
*G11C 29/44* (2006.01)

(52) U.S. Cl.
CPC ........ *G11C 29/38* (2013.01); *G11C 29/12005* (2013.01); *G11C 29/44* (2013.01)

(58) Field of Classification Search
CPC ........................................ G11C 29/56
USPC ........................................ 714/719
See application file for complete search history.

(56) References Cited

U.S. PATENT DOCUMENTS

| | | | |
|---|---|---|---|
| 8,856,615 B1* | 10/2014 | Krishnan | H03M 13/2957 714/718 |
| 2014/0355861 A1* | 12/2014 | Nirenberg | H04N 19/85 382/133 |
| 2015/0205652 A1* | 7/2015 | Noguchi | G06F 3/06 714/819 |
| 2017/0117061 A1* | 4/2017 | Sharon | G11C 29/44 |

FOREIGN PATENT DOCUMENTS

KR    1020140112349    9/2014

* cited by examiner

*Primary Examiner* — Fritz Alphonse
(74) *Attorney, Agent, or Firm* — IP & T Group LLP

(57) ABSTRACT

A method for operating a data storage device includes obtaining test data from a target region of a memory block by applying a test bias simultaneously to all word lines of the memory block; and estimating a state of the memory block based on the test data.

20 Claims, 15 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0013003, flied on Feb. 2, 2016, in the Korean Intellectual Property Office, which is Incorporated herein by reference in its entirety.

BACKGROUND

1. Technical Field

Various embodiments generally relate to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a method for operating a data storage device may include: obtaining test data from a target region of a memory block by applying a test bias simultaneously to all word lines of the memory block; and estimating a state of the memory block based on the test data.

In an embodiment, a method for operating a data storage device may include: determining a target region between first and second regions of a memory block; selecting one of first and second biases based on the target region; obtaining test data from the target region by applying a selected test bias simultaneously to all word lines of the memory block; and estimating a state of the memory block based on the test data.

In an embodiment, a method for operating a data storage device may include: comparing threshold voltages of respective strings included in a target region of a memory block, with a test bias, each of the strings including a plurality of memory cells which are coupled to a plurality of word lines; and estimating a state of the memory block based on a comparison result.

DETAILED DESCRIPTION

Figure 1:
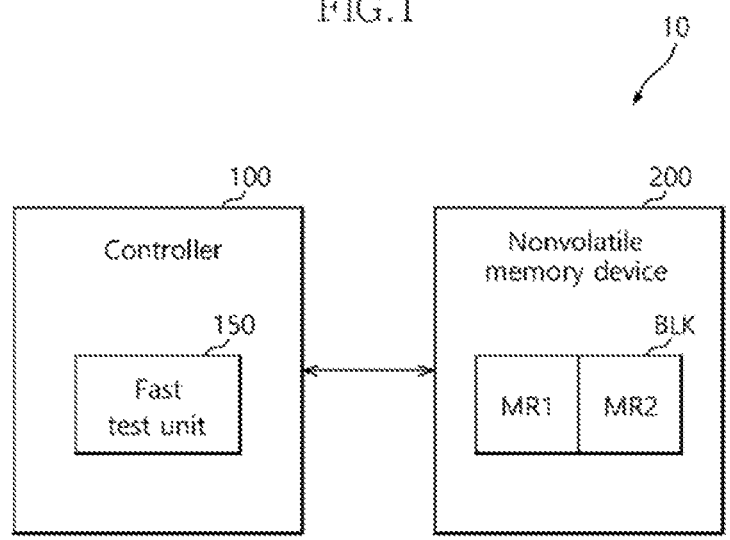
FIG. 1 is a block diagram illustrating a data storage device, according to an embodiment of the invention.

Hereinafter, various embodiments of the invention, including a data storage device and an operating method thereof will be described with reference to the accompanying drawings. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood that embodiments of the present invention are not limited to the particulars shown in the drawings, that the drawings are not necessarily to scale, and, in some instances, proportions may have been exaggerated to more clearly depict certain features of the invention. While particular terminology is used, it is to be appreciated that the terminology used is for describing particular embodiments only and is not intended to limit the scope of the present invention.

FIG. 1 is a block diagram illustrating a data storage device 10 according to an embodiment of the invention.

Referring to FIG. 1, the data storage device 10 may be configured to store data provided from an external device (not shown), in response to a write request from the external device. Also, the data storage device 10 may be configured to provide stored data to the external device, in response to a read request from the external device.

The data storage device 10 may be configured as a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD), and the like.

The data storage device 10 may include a controller 100 and a nonvolatile memory device 200.

The controller 100 may control general operations of the data storage device 10. The controller 100 may store data in the nonvolatile memory device 200 in response to a write request transmitted from the external device. Further, the controller 100 may read out data stored in the nonvolatile memory device 200 and output read-out data to the external device in response to a read request transmitted from the external device.

The controller 100 may include a fast test unit 150.

The fast test unit 150 may perform a fast test operation by determining a target region between first and second regions MR1 and MR2 of a memory block BLK included in the nonvolatile memory device 200, selecting a bias between first and second test biases based on the target region, obtaining test data from the target region through simultaneously applying a selected test bias to all word lines of the memory block BLK, and determining a state of the memory block BLK based on the test data. The fast test unit 150 may count the number of bits corresponding to a specified bit value in the test data, calculate a damage value based on the counted number, determine whether the damage value exceeds a reference value, and estimate a state of the memory block BLK based on a determination result.

In an embodiment, the fast test unit 150 may compare a first damage value calculated when the first region MR1 is the target region and a second damage value calculated when the second region MR2 is the target region, and estimate a state of the memory block BLK based on the comparison result.

The fast test unit 150 may apply a test bias to the memory block BLK, compare threshold voltages of respective strings included in the target region of the memory block BLK, with the test bias, and estimate a state of the memory block BLK based on a comparison result. The fast test unit 150 may count the number of strings the threshold voltages of which are in a predetermined direction from the test bias, based on the comparison result. The counted number may mean the number of bits corresponding to the specified bit value in the test data. The predetermined direction may be determined according to whether the target region is the first region MR1 or the second region MR2.

The fast test operation may be performed for at least one of the first and second regions MR1 and MR2, i.e., the fast test operation may be performed for only the first region MR1, may be performed for only the second region MR2, or may be performed for both the first and the second regions MR1 and MR2. In an embodiment, a detailed test object may be to figure out data damage of the memory block BLK regardless of a cause thereof. Alternatively, a test object may be to figure out a detailed cause of data damage. For example, the detailed cause of data damage may be a read disturbance influence or a retention issue.

For example, in order to figure out data damage by the retention issue, the fast test unit 150 may perform the fast test operation for the first region MR1. Further, in order to figure out data damage by a read disturbance influence, the fast test unit 150 may perform the fast test operation for the first and second regions MR1 and MR2. Still further, in order to figure out only data damage regardless of a cause thereof, the fast test unit 150 may perform the fast test operation for the second region MR2.

The fast test unit 150 may determine whether at least one of a plurality of trigger conditions is satisfied, and determine the target region between the first and second regions MR1 and MR2 based on a satisfied trigger condition. The trigger conditions may be based on, for example, a read count and a predetermined cycle corresponding to a memory block. Trigger conditions may correspond to the above-described test object. For example, a read count may be used to figure out a read disturbance influence, and a predetermined cycle may be used to figure out a retention issue. Also, in order to figure out data damage at an appropriate timing, whether a predetermined process has been processed or whether power on/off have occurred may be used as trigger conditions.

The test bias may include first and second test biases. The fast test unit 150 may select the first test bias when the target region is the first region MR1, and select the second test bias when the target region is the second region MR2. The first and second test biases may be different. In an embodiment, the first test bias may be greater than the second test bias.

As a result, when it is determined as a result of the fast test operation that data damage of the memory block BLK is substantial, the controller 100 may perform a recovery operation for the memory block BLK. The controller 100 may perform an appropriate recovery operation according to a cause of the data damage. For example, when data damage due to a retention issue cannot be ascertained, the controller 100 may perform a recovery operation for the entire memory block BLK. Or, also, for example, when data damage according to a read disturbance influence cannot be ascertained, the controller 100 may perform a recovery operation for a region on which a read disturbance influence is exerted in a concentrated manner in the memory block BLK.

The controller 100 may set an appropriate read bias to be used in a read operation, according to a cause of data damage. For example, the controller 100 may manage information regarding read biases to be used according to a cause of data damage, and may select an appropriate read bias by referring to the corresponding information in need.

The nonvolatile memory device 200 may store data transmitted from the controller 100 and may read out stored data and transmit read-out data to the controller 100, according to control of the controller 100. The nonvolatile memory device 200 may obtain test data from a target region by applying a test bias to all word lines of a memory block BLK and transmit the obtained test data to the controller 100, according to the control of the controller 100.

The nonvolatile memory device 200 may include the memory block BLK. The memory block BLK may include the first region MR1 and the second region MR2. The first region MR1 may be a region where data are stored, while the second region MR2 may be a region where data are not stored. When the memory block BLK includes a plurality of pages and the controller 100 processes data by a predetermined data unit (e.g., by the unit of a data chunk), the second region MR2 may include a region remaining when the respective pages are divided by the unit of a data chunk. The second region MR2 may include memory cells which are coupled to outermost bit lines among a plurality of bit lines of the memory block BLK.

The nonvolatile memory device 200 may Include flash memory, such as NAND flash or NOR flash, Ferroelectrics Random Access Memory (FeRAM), Phase-Change Random Access Memory (PCRAM), Magnetoresistive Random Access Memory (MRAM), Resistive Random Access Memory (ReRAM), and the like.

Figure 2:
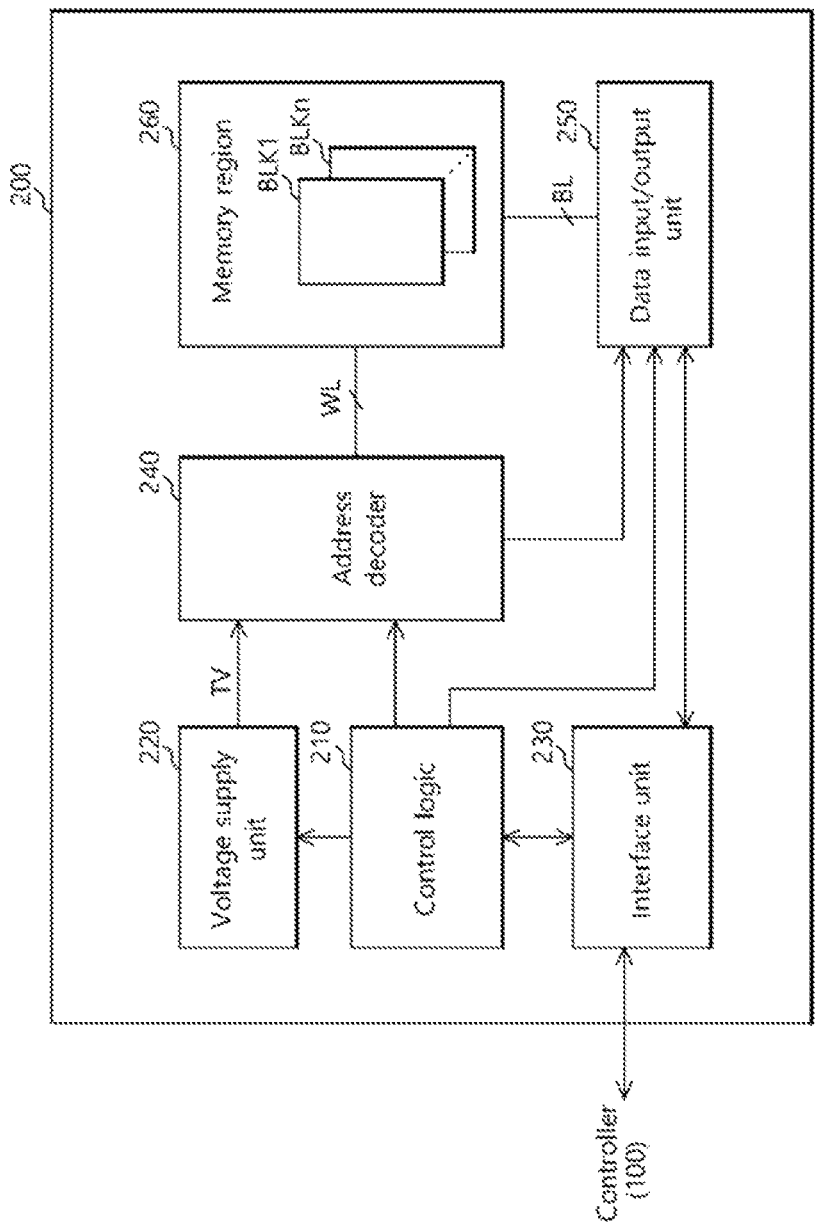
FIG. 2 is a block diagram illustrating the nonvolatile memory device shown in FIG. 1.

FIG. 2 is a block diagram illustrating the nonvolatile memory device 200 shown in FIG. 1.

According to the embodiment of FIG. 2, the nonvolatile memory device 200 may include a control logic 210, a voltage supply unit 220, an interface unit 230, an address decoder 240, a data input/output unit 250, and a memory region 260.

The control logic 210 may control general operations of the nonvolatile memory device 200 according to the control of the controller 100. The control logic 210 may receive a command transmitted from the controller 100, from the interface unit 230, and may transmit control signals to internal units of the nonvolatile memory device 200 in response to the command.

The control logic 210 may perform a control task according to the control of the controller 100 so that a test bias TV is simultaneously applied to all word lines for a memory block selected among memory blocks BLK1 to BLKn included in the memory region 260 and the data input/output unit 250 outputs test data.

The voltage supply unit 220 may generate various operation voltages necessary for carrying out the general operations of the nonvolatile memory device 200, according to control of the control logic 210. The voltage supply unit 220 may supply the test bias TV to the address decoder 240.

The interface unit 230 may exchange various control signals Including commands, addresses and data with the controller 100. The interface unit 230 may transmit various control signals and data inputted thereto, to the internal units of the nonvolatile memory device 200.

The address decoder 240 may decode addresses to select portions to be accessed in the memory region 260. The address decoder 240 may selectively drive word lines WL and control the data input/output unit 250 to selectively drive bit lines BL, according to decoding results. The address decoder 240 may simultaneously apply the test bias TV to all word lines of a selected memory block.

The data input/output unit 250 may transmit data transmitted from the interface unit 230, to the memory region 260 through the bit lines BL. The data input/output unit 250 may transmit data read out from the memory region 260 through the bit lines BL, to the interface unit 230. The data input/output unit 250 may sense current formed as memory cells included in the memory region 260 are turned on and off in response to a read bias, and may obtain data read out from the memory cells, according to the sensing results. The data input/output unit 250 may sense current formed in bit lines corresponding to a memory block when the test bias TV is applied to the memory block, and may obtain test data according to the sensing results.

The memory region 260 may be coupled with the address decoder 240 through the word lines WL, and may be coupled with the data input/output unit 250 through the bit lines BL. The memory region 260 may include a plurality of memory cells which are respectively disposed at areas where the word lines WL and the bit lines BL intersect with each other and in which data are stored. The memory region 260 may include memory cell arrays of a two-dimensional or three-dimensional structure.

The memory region 260 may include a plurality of memory blocks BLK1 to BLKn. Each of the memory blocks BLK1 to BLKn may include the first region MR1 and the second region MR2 shown in FIG. 1.

Figure 3:
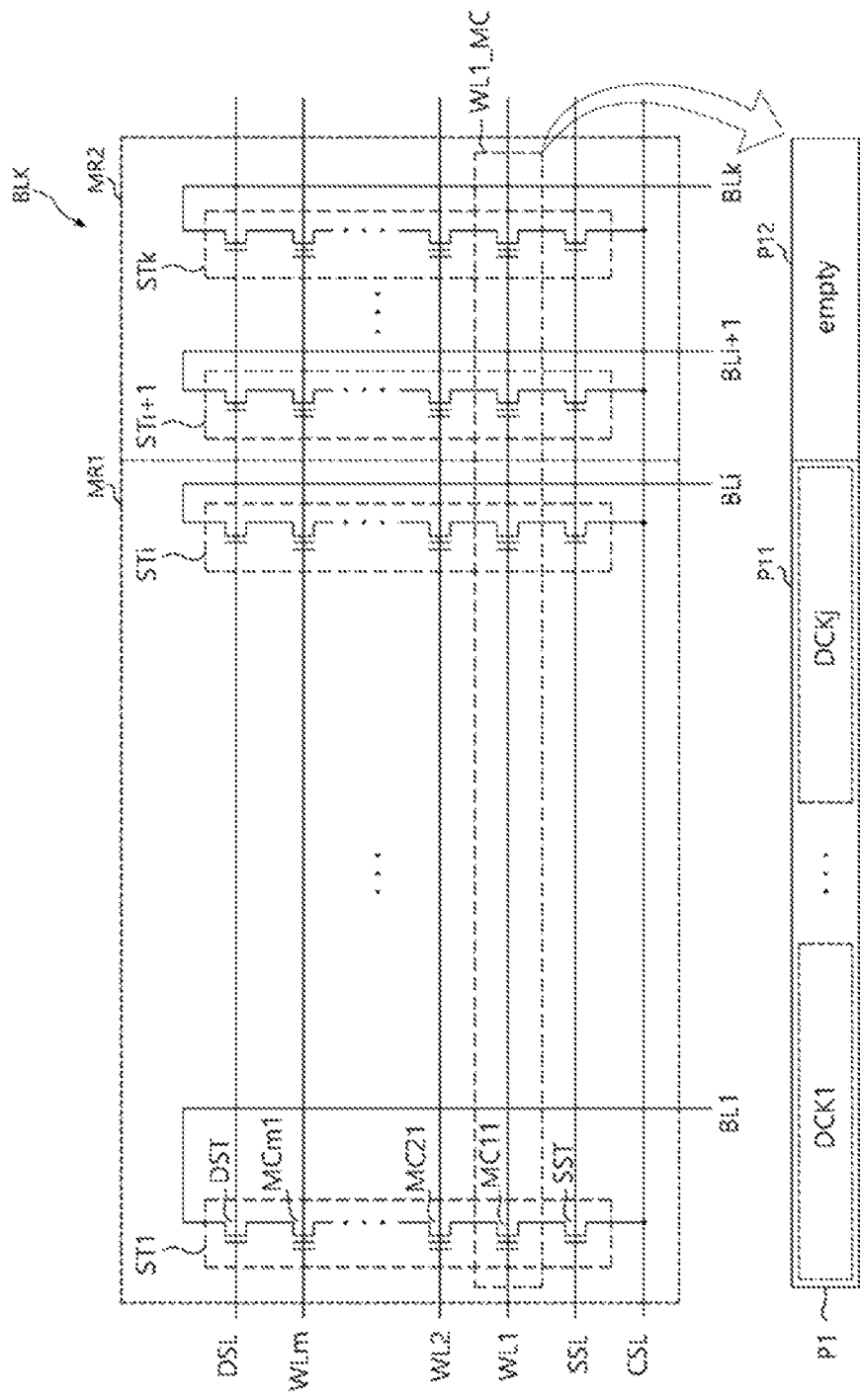
FIG. 3 is a detailed circuit diagram illustrating the memory block shown in FIG. 1.

FIG. 3 is a detailed circuit diagram of the memory block BLK shown in FIG. 1, according to an embodiment of the invention.

Referring to FIG. 3, the memory block BLK may include strings ST1 to STk. Each of the strings ST1 to STk may be coupled between a source line SL and a corresponding bit line among a plurality of bit lines BL1 to BLk. For example, the string ST1 may be coupled between the source line CSL and a bit line BL1.

The strings ST2 to STk may be configured in substantially the same way as the string ST1, and therefore, the string ST1 will be described as an example. The string ST1 may include a drain select transistor DST, memory cells MC11 to MCm1, and a source select transistor SST. The drain select transistor DST may have a drain which is coupled to the bit line BL1 and a gate which is coupled to a drain select line DSL. The source select transistor SST may have a source which is coupled to the source line CSL and a gate which is coupled to a source select line SSL. The memory cells MC11 to MCm1 may be coupled in series between the drain select transistor DST and the source select transistor SST. Gates of the memory cells MC11 to MCm1 may be coupled to word lines WL1 to WLm, respectively.

Each of the word lines WL1 to WLm may be coupled to corresponding memory cells of the strings ST1 to STk. For example, the word line WL1 may be coupled to memory cells WL1_MC which are included in the strings ST1 to STk, respectively. Memory cells may be written when corresponding word lines are selected in a write operation. For example, the memory cells WL1_MC may be simultaneously written when the word line WL1 is selected in the write operation.

Each word line may correspond to at least one page according to the number of bits to be stored in each memory cell. For example, when 1 bit is stored in each memory cell, the word line WL1 may correspond to one page P1. According to an embodiment, when 2 bits, that is, a least significant bit (LSB) and a most significant bit (MSB) are stored in each memory cell, each word line may correspond to an LSB page and an MSB page in which LSBs and MSBs are respectively stored.

The memory block BLK may include the first region MR1 and the second region MR2.

The first region MR1 may include the strings ST1 to STi. The first region MR1 may be a region where data are stored.

The second region MR2 may include the strings STi+1 to STk. The second region MR2 may be a region where data are not stored. In other words, even though memory cells included in the first region MR1 exist in a written state, memory cells included in the second region MR2 may exist in an erased state.

When the controller 100 processes data by a predetermined data unit (e.g., by the unit of a data chunk), the second region MR2 may be a region remaining when respective pages are divided by the unit of a data chunk. For example, in the page P1, a plurality of data chunks DCK1 to DCKj may be stored in a region P11 which is included in the first region MR1, and a remaining region P12 being in an erased state may be included in the second region MR2.

Figure 4:
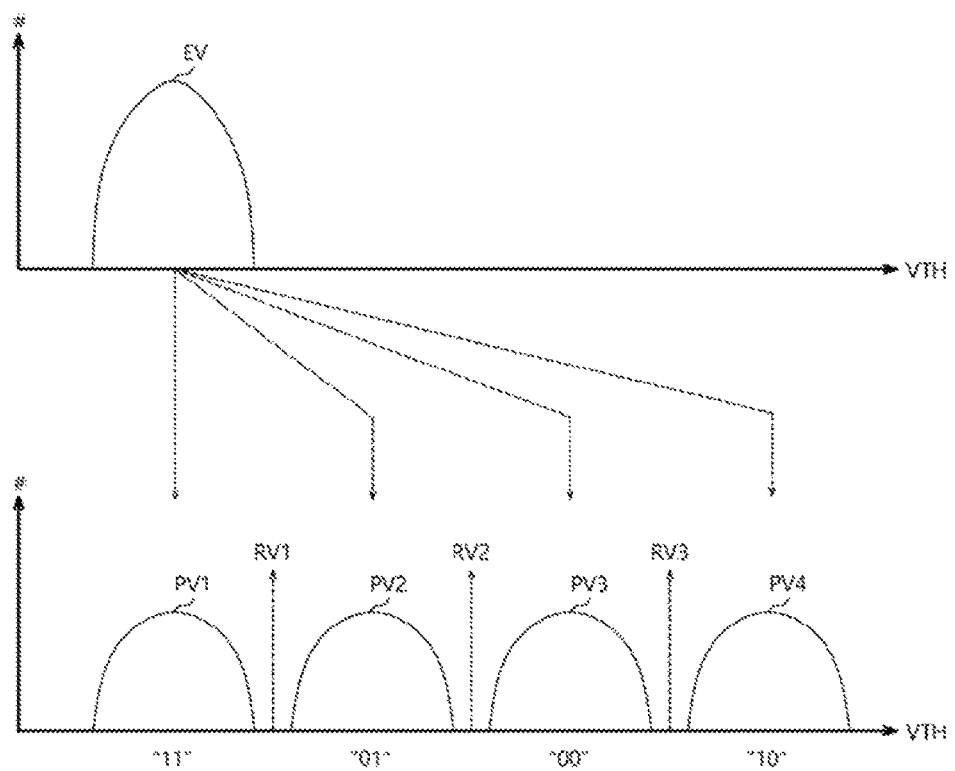
FIG. 4 is a diagram illustrating threshold voltage distributions of memory cells.

FIG. 4 is a diagram illustrating threshold voltage distributions EV and PV1 to PV4 of memory cells. The horizontal axis VTH represents a threshold voltage of a memory cell, and the vertical axis # represents the number of memory cells corresponding to a threshold voltage. For Illustration, FIG. 4 illustrates a case in which 2 bits are stored in each memory cell.

Referring to FIG. 4, memory cells included in the memory block BLK may form a threshold voltage distribution EV when they are erased. The memory cells may form threshold voltage distributions PV1 to PV4 according to data stored therein when they are written with the data. A memory cell may be controlled to have a threshold voltage corresponding to any one among the 4 threshold voltage distributions PV1 to PV4, according to 2-bit data stored therein. For example, a memory cell stored with data "01" may have a threshold voltage corresponding to the threshold voltage distribution PV2. The threshold voltage distribution PV1 may be substantially the same as levels of the threshold voltage distribution EV.

For reading data stored in memory cells, read biases RV1 to RV3 capable of identifying the threshold voltage distributions PV1 to PV4 may be used. A memory cell may be turned on or off according to a threshold voltage, when a predetermined read bias is applied through a corresponding word line. For example, a memory cell may be turned on when a read bias greater than the memory cell's threshold voltage is applied. Or, also for example, a memory cell may be turned off when a read bias less than the memory cell's threshold voltage is applied. Current may be formed in a corresponding bit line when a memory cell is turned on or off, and data may be obtained as corresponding current is sensed. For example, data "1" may be obtained when a memory cell is turned on, and data "0" may be obtained when a memory cell is turned off. Therefore, based on data obtained as respective read voltage biases are applied to memory cells, data stored in the memory cells may be read.

Figure 5:
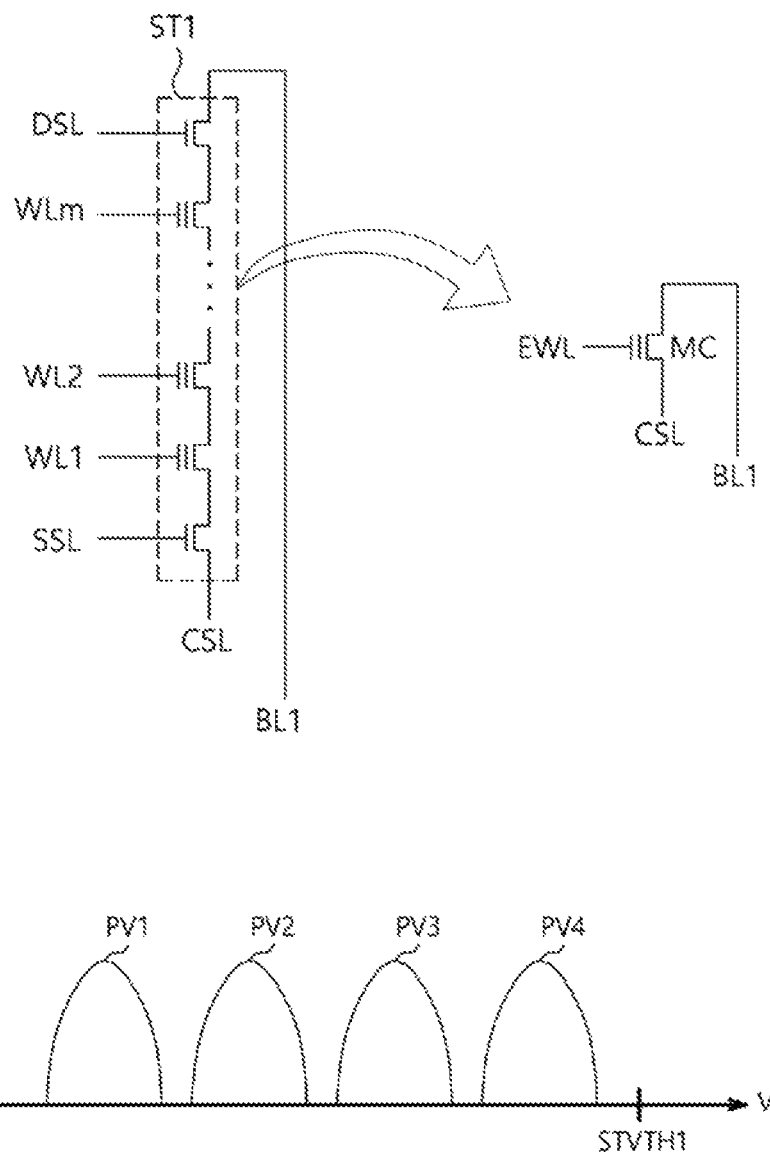
FIG. 5 is a diagram to assist in the explanation of an operation of simultaneously applying a read bias to the word lines of a memory block.

FIG. 5 is a diagram to assist in the explanation of an operation of simultaneously applying a read voltage bias to the word lines WL1 to WLm of the memory block. For illustration, FIG. 5 shows the string ST1 and the threshold voltage distributions PV1 to PV4 of the memory cells included in the string ST1.

Referring to FIG. 5, when a predetermined read voltage bias is applied simultaneously to the word lines WL1 to WLm, the memory cells of the string ST1 may operate like one memory cell MC to which the predetermined read bias is applied through a word line EWL. At this time, the threshold voltage of the memory cell MC may be determined based on a read bias which turns on all the memory cells of the string ST1. A string threshold voltage STVTH1 is greater than the threshold voltages of all the memory cells of the string ST1, as shown in FIG. 5. The string threshold voltage STVTH1 may be determined substantially by a maximum threshold voltage among the threshold voltages of all the memory cells of the string ST1 so that upon application all the memory cells of the string ST1 can be turned on.

Figure 6:
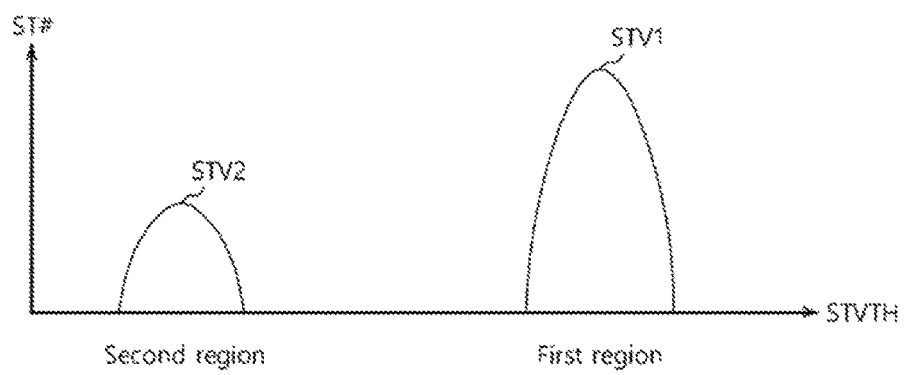
FIG. 6 is a diagram illustrating string threshold voltage distributions.

FIG. 6 is a diagram illustrating string threshold voltage distributions STV1 and STV2 of the strings ST1 to STk of the memory block BLK in FIG. 3. The horizontal axis STVTH represents a string threshold voltage, and the vertical axis ST# represents the number of strings corresponding to a string threshold voltage.

Referring to FIG. 6, each of the strings ST1 to STk may have a string threshold voltage according to data stored in memory cells thereof, as described above with reference to FIG. 5. For example, each of the strings ST1 to STk may have a string threshold voltage which is determined according to a maximum threshold voltage for the memory cells of that string. Thus, the strings ST1 to STk may form string threshold voltage distributions STV1 and STV2.

The string threshold voltage distribution STV2 may be formed by the strings STi+1 to STk which are included in the second region MR2 of the memory block BLK. That is to say, since the second region MR2 is not written, that is, the second region MR2 is in an erased state, the strings STi+1 to STk may form the string threshold voltage distribution STV2 which is relatively low.

The string threshold voltage distribution STV1 may be formed by the strings ST1 to STi which are included in the first region MR1 of the memory block BLK. That is to say, since the first region MR1 is written, the strings ST1 to STi may form the string threshold voltage distribution STV1 which is relatively high.

Figure 7A:
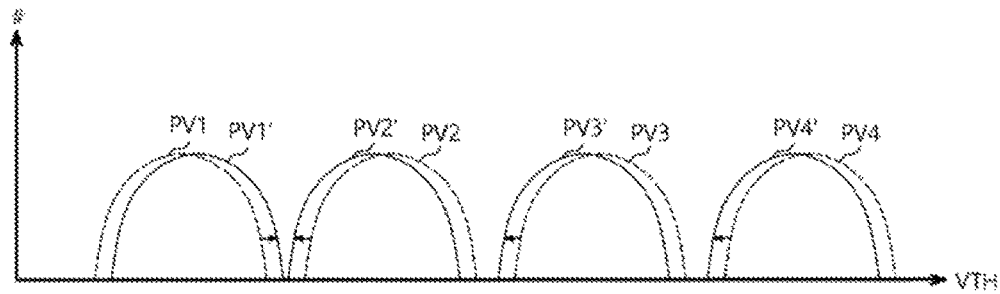
FIG. 7A is a diagram illustrating changes in the threshold voltage distributions of the memory cells.

FIG. 7A is a diagram illustrating changes in the threshold voltage distributions PV1 to PV4 of the memory cells.

Referring to FIG. 7A, the memory cells included in the memory block BLK shown in FIG. 3 may have threshold voltages different from those immediately after they are written with data, due to various causes. For example, when a read operation is performed for a certain word line, memory cells coupled to remaining word lines may be influenced by a read disturbance, and due to this fact, may have threshold voltages different from those immediately after they are written with data. Also, for example, as the amounts of charges charged in floating gates when the memory cells are written with data are changed with the lapse of time, that is, due to a retention issue, the memory cells may have threshold voltages different from those immediately after they are written with data. As a result, the threshold voltage distributions PV1 to PV4 may shift to form modified or shifted threshold voltage distributions PV1' to PV4', respectively. Hence, due to a read disturbance influence and/or a retention issue, threshold voltages of memory cells which form the threshold voltage distribution PV1, that is, erased memory cells or memory cells which are stored with data "11", may increase, i.e., shift to the right; whereas, threshold voltages of memory cells which form the program threshold voltage distributions PV2 to PV4, that is, memory cells which are stored with data "01", "00" and "10," may decrease, i.e. shift to the left.

Figure 7B:
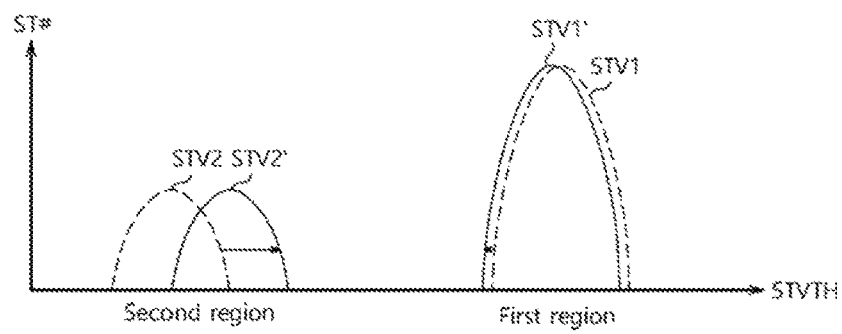
FIGS. 7B and 7C are diagrams illustrating changes in the string threshold voltage distributions.
Figure 7C:
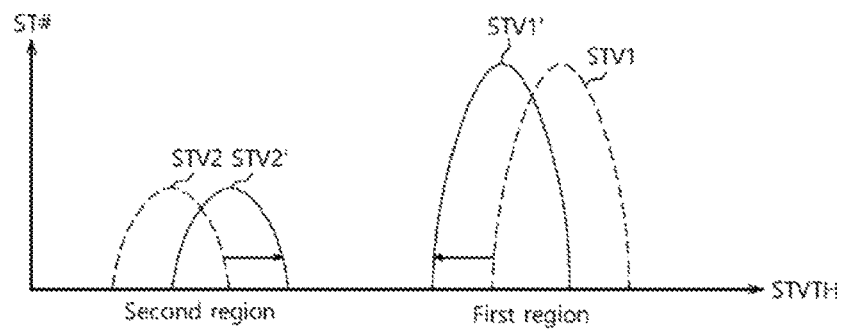

FIGS. 7B and 7C are diagrams illustrating changes in the string threshold voltage distributions STV1 and STV2 of the strings ST1 to STk of the memory block BLK.

As the threshold voltages of memory cells are changed as shown in FIG. 7A because of the read disturbance influence and/or a retention issue, the string threshold voltage distributions STV1 and STV2 of the strings ST1 to STk may also shift.

Referring to FIG. 7B, we have observed, that when a retention issue is not considered and only a read disturbance influence is considered, the string threshold voltage distribution STV2 is subjected to a substantial shift to a new modified string threshold voltage distribution STV2'. While, the string threshold voltage distribution STV1 shifts only finely to a string threshold voltage distribution STV1' even though a read disturbance influence is exerted.

The reason to this may be as follows. First, since a read disturbance influence is exerted by the unit of a word line, memory cells of a single string may be influenced, by turns, by a read disturbance. Because the threshold voltages of memory cells in which data "01", "00" and "10" are stored decrease by a read disturbance influence, the threshold voltages of memory cells which are influenced by a read disturbance in the first region MR1 may decrease mostly. Despite that, a maximum threshold voltage of memory cells of a certain string of the first region MR1 will not be changed until a memory cell itself having the maximum threshold voltage is influenced by a read disturbance. As a result, since the threshold voltage of a certain string is substantially determined based on a maximum threshold voltage of the memory cells of the string, string threshold voltages of the first region MR1 may not be changed or may move only finely as the maximum threshold voltage decreases with a low frequency, for the a read disturbance influence.

Next, because the threshold voltages of erased memory cells increase by a read disturbance influence, all of the threshold voltages of memory cells which are influenced by a read disturbance in the second region MR2 increase. In this case, a maximum threshold voltage of memory cells of a certain string in the second region MR2 will increase when even any one memory cell is influenced by a read disturbance. Accordingly, string threshold voltages of the second region MR2 may generally increase by a read disturbance influence, and as a result, the string threshold voltage distribution STV2 may shift in a substantial amount to a modified string threshold voltage distribution STV2' which is substantially different than the threshold voltage distribution STV2.

Summarizing these, since the string threshold voltage distributions of the first region MR1 and the second region MR2 exhibit different movements (or shifts) when subjected to the read disturbance influence, it is possible to estimate whether a current state of a memory block BLK is substantially influenced by a read disturbance.

Referring to FIG. 7C, when a read disturbance influence is not considered and only a retention issue is considered, both the string threshold voltage distributions STV1 and STV2 may move to string threshold voltage distributions STV1' and STV2'.

The reason to this is may be as follows. First, because a retention issue occurs in all memory cells with the lapse of time, the threshold voltages of all the memory cells may be changed by a retention issue as shown in FIG. 7A. Accordingly, because a maximum threshold voltage of memory cells in each of the strings ST1 to STi of the first region MR1 will decrease by a retention issue, the string threshold voltages of all the strings ST1 to STi of the first region MR1 may decrease, and as a result, the string threshold voltage distribution STV1 may move to a string threshold voltage distribution STV1'. Next, because a maximum threshold voltage of memory cells in each of the strings STi+1 to STk of the second region MR2 will increase by a retention issue, the string threshold voltages of all the strings STi+1 to STk of the second region MR2 may increase, and as a result, the string threshold voltage distribution STV2 may move to a string threshold voltage distribution STV2'.

Summarizing these, since the string threshold voltage distribution STV1 of the first region MR1 reflects reliably a state with respect to a retention issue, by figuring out such a state, it is possible to estimate that whether a current memory block BLK is substantially influenced by a retention issue. Moreover, since the string threshold voltage distribution STV2 of the second region MR2 substantially reflects both states with respect to a retention issue and a read disturbance influence, by figuring out such states, it is possible to estimate data damage itself, regardless of a cause.

Figure 8:
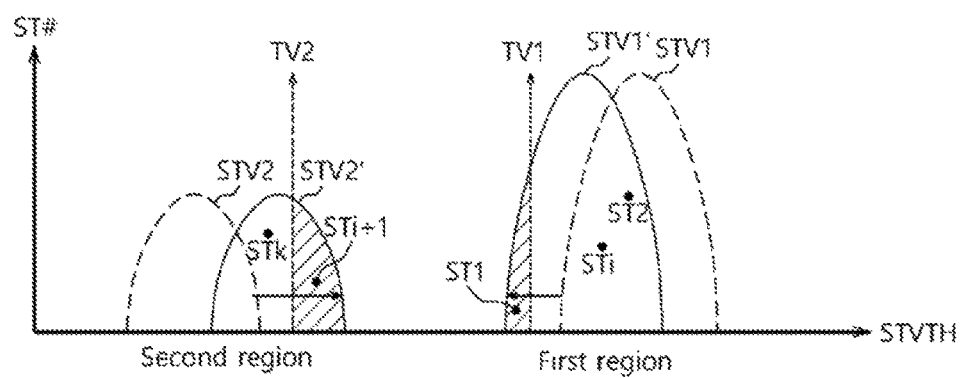
FIGS. 8, 9A and 9B are diagrams to assist in the explanation of a method for operating the data storage device of FIG. 1.
Figure 9A:
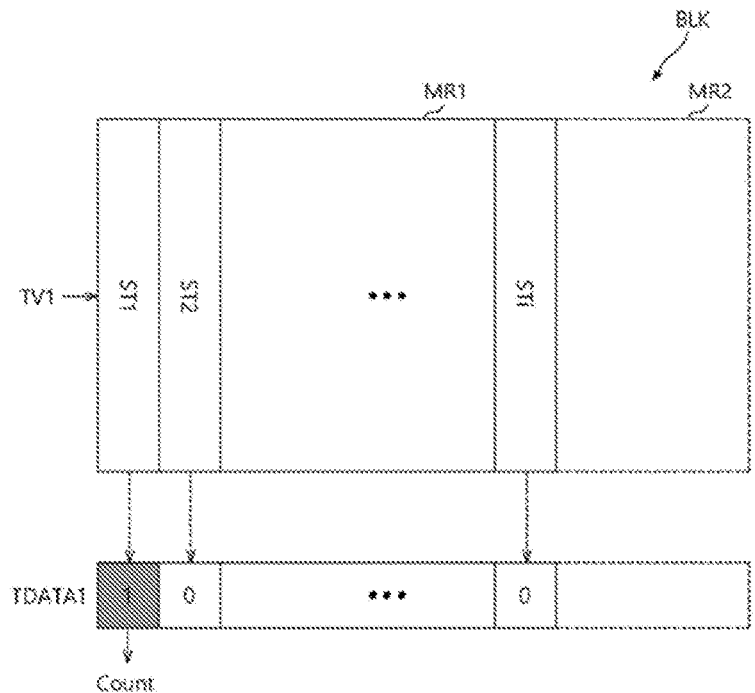
Figure 9B:
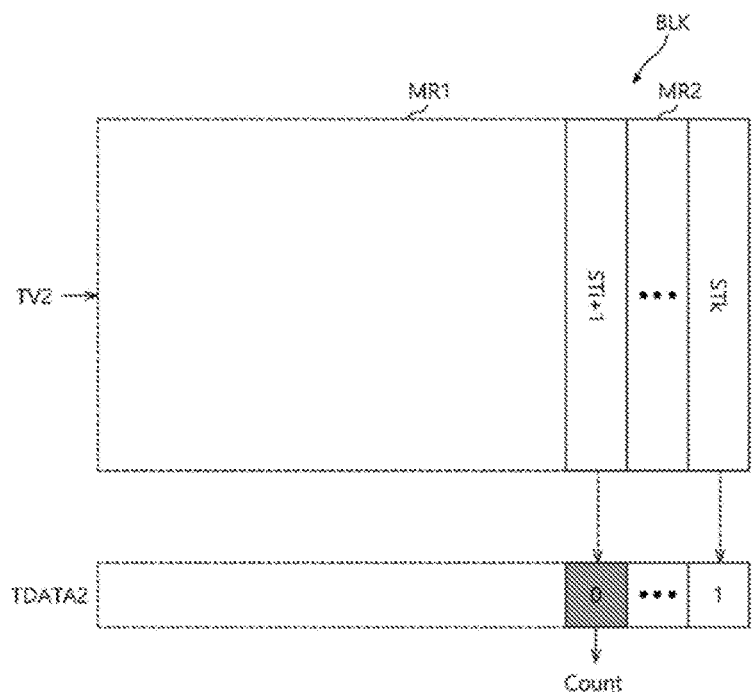

FIGS. 8, 9A and 9B are diagrams to assist in the explanation of a method for operating the data storage device 10 of FIG. 1. FIG. 8 illustrates changes of the string threshold voltage distributions STV1 and STV2 of the strings ST1 to STk of the memory block BLK due to a read disturbance influence and a retention issue occurring simultaneously. For example, as illustrated in FIG. 8, the string threshold voltage distributions STV1 and STV2 shift to substantially modified string threshold voltage distributions STV1' and STV2', respectively. Since the string threshold voltages of the first region MR1 experience only a retention issue and the string threshold voltages of the second region MR2 are additionally influenced by a read disturbance in addition to a retention issue, the string threshold voltage distribution STV2 of the second region MR2 may move further then the string threshold voltage distribution STV1 of the first region MR1.

FIG. 9A shows a case where the target region of the fast test operation is the first region MR1, whereas FIG. 9B shows a case where the target region of the fast test operation is the second region MR2.

FIGS. 9A and 9B exemplarily illustrate first and second test data TDATA1 and TDATA2 respectively obtained from the first and second regions MR1 and MR2 when first and second test biases TV1 and TV2 are respectively inputted to all the word lines WL1 to WLm of the memory block BLK.

Referring to FIGS. 8 and 9A, the fast test operation may be performed for the first region MR1, based on the first test bias TV1. When the first test bias TV1 is simultaneously applied to all the word lines WL1 to WLm of the memory block BLK, the first test data TDATA1 corresponding to the respective strings ST1 to STi may be obtained based on the current flowing in the bit lines coupled to the respective strings ST1 to STi of the first region MR1. In the first test data TDATA1, for example, "1" may be outputted from the string ST1 which has a string threshold voltage less than the first test bias TV1, and, for example, "0" may be outputted from the strings ST2 and STi which have string threshold voltages greater than the first test bias TV1.

Then, a first damage value may be calculated based on the number of bits corresponding to "1" in the first test data TDATA1. In other words, the first damage value may be calculated based on the number of strings of which string threshold voltages are less than the first test bias TV1, in the first region MR1. The first damage value may be, for example, the number of bits corresponding to "1" in the first test data TDATA1 or a rate of bits corresponding to "1" in the entirety of the first test data TDATA1. The first damage value may correspond to the hatched region in the string threshold voltage distribution STV1' of FIG. 8. Hence, the greater the first damage value, the more likely it is that the string threshold voltage distribution STV1 has moved leftward.

Moreover, when the first damage value exceeds a first reference value, it may be estimated that data damage due to a retention issue has occurred in the memory block BLK.

According to an embodiment, the nonvolatile memory device 200 may obtain test data corresponding to all strings of the memory block BLK, and may extract the first test data TDATA1 corresponding to the first region MR1 among the data.

Referring to FIGS. 8 and 9B, the fast test operation may be performed for the second region MR2, based on the second test bias TV2. When the second test bias TV2 is simultaneously applied to all the word lines WL1 to WLm of the memory block BLK, the second test data TDATA2 corresponding to the respective strings STi+1 to STk may be obtained based on the current of the bit lines coupled to the respective strings STi+1 to STk of the second region MR2. In the second test data TDATA2, for example, "0" may be outputted from the string STi+1 which has a string threshold voltage greater than the second test bias TV2, whereas, for example, "1" may be outputted from the string STk which has a string threshold voltage less than the second test bias TV2.

Hence, a second damage value may be calculated based on the number of bits corresponding to "0" in the second test data TDATA2. In other words, the second damage value may be calculated based on the number of strings having threshold voltages greater than the second test bias TV2, in the second region MR2. The second damage value may be, for example, the number of bits corresponding to "0" in the second test data TDATA2, or a rate of bits corresponding to "0" in the entirety of the second test data TDATA2. The second damage value may correspond to the hatched region in the string threshold voltage distribution STV2' of FIG. 8. For example, the greater the second damage value is high, the greater is the likelihood that that the string threshold voltage distribution STV2 has shifted rightward.

Moreover, when the second damage value exceeds a second reference value, it may be estimated that data damage due to a retention issue has occurred in the memory block BLK.

The first and second test biases TV1 and TV2 and the first and second reference values may be preset, for example, through experiments.

FIGS. 10 to 13 are flow charts illustrating a method for operating the data storage device 10 of FIG. 1. Hereinbelow, the method for operating the data storage device 10 including the controller 100 and the nonvolatile memory 200, which includes the first region MR1 and the second region MR2, will be described in detail with reference to FIGS. 1 and 10 to 13.

Figure 10:
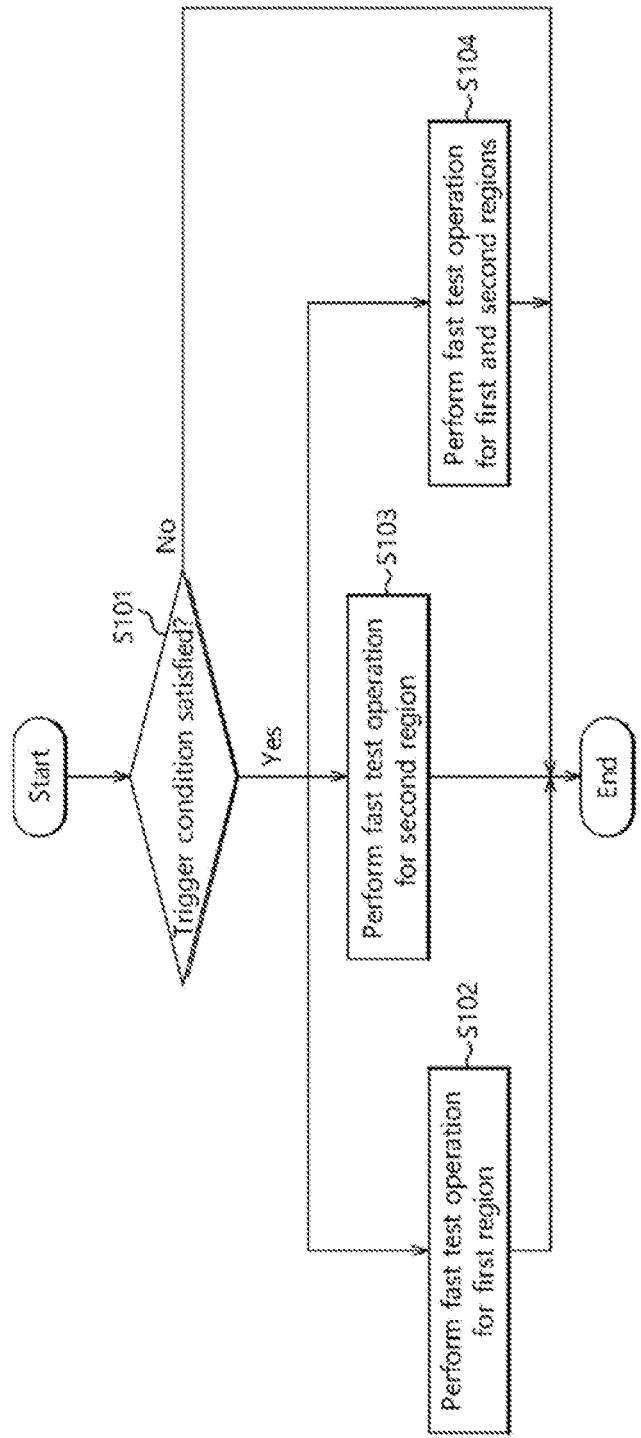
FIGS. 10 to 13 are flow charts of a method for operating the data storage device of FIG. 1, according to an embodiment of the invention.

Referring to FIG. 10, at step S101, the controller 100 may determine whether a trigger condition is satisfied. The controller 100 may manage a plurality of trigger conditions according to various objectives. In the case where the trigger condition is not satisfied (NO in step S101), the process may be ended. In the case where the trigger condition is satisfied (YES in step S101), the process may proceed to any one of a plurality of steps, for example steps S102 to S104, which is selected according to the satisfied trigger condition.

The trigger condition may be, for example, whether a predetermined period has passed. The predetermined period may be used to figure out a retention issue. In the case where the predetermined period has passed, the process may proceed to the step S102.

At step S102, the controller 100 may perform a fast test operation for the first region MR1. That is to say, the controller 100 may perform the fast test operation for the first region MR1 which exhibits a string threshold voltage change due to a retention issue.

Also, at the step S101, the trigger condition may figure out data damage at an appropriate timing regardless of a cause thereof. For example, the trigger condition may be whether a predetermined period has passed, whether a predetermined process has been performed or whether a power-on/off has occurred. In the case where such a trigger condition is satisfied, the process may proceed to the step S103.

At the step S103, the controller 100 may perform the fast test operation for the second region MR2. That is to say, the controller 100 may perform the fast test operation for the second region MR2 which exhibits a string threshold voltage change regardless of a cause thereof.

Further, at step S101, the trigger condition may be, for example, whether a read count corresponding to the memory block BLK has reached a threshold count. The read count may be used to figure out a read disturbance influence. In the case where the read count has reached the threshold count, the process may proceed to the step S104.

At step S104, the controller 100 may perform the fast test operation for the respective first and second regions MR1 and MR2. That is to say, the controller 100 may perform the fast test operation for the respective first and second regions MR1 and MR2 which exhibit different string threshold voltage changes when they are influenced by a read disturbance.

Figure 11:
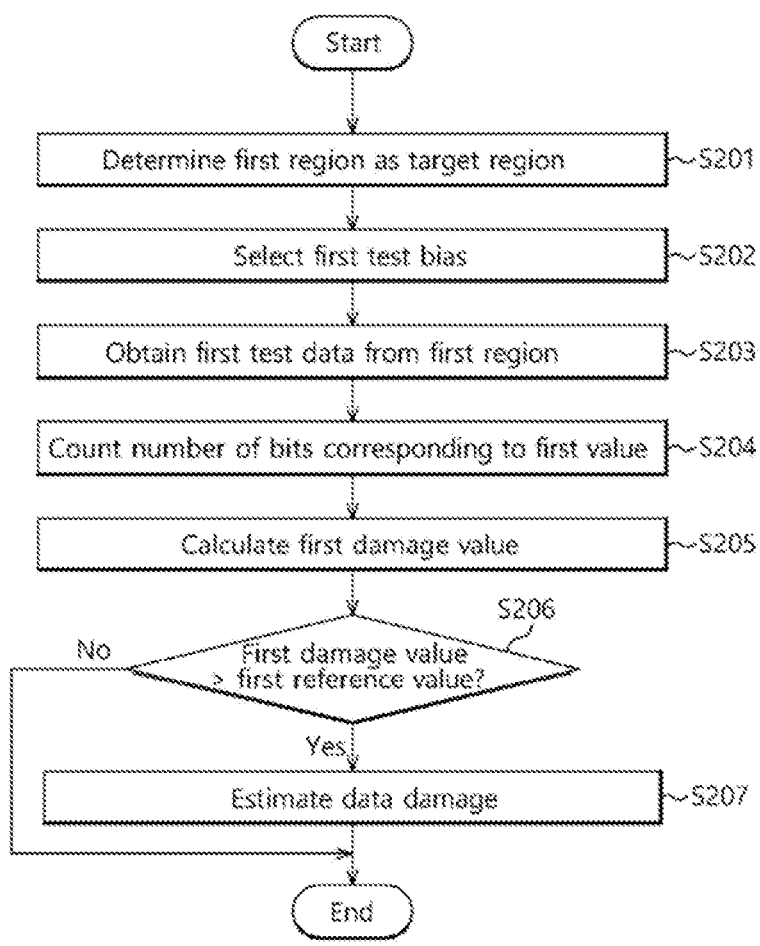

Referring to FIG. 11, there is shown a method for performing the fast test operation for the first region MR1. The method shown in FIG. 11 may be an embodiment of the step S102 of FIG. 10.

At step S201, the controller 100 may determine the first region MR1 as the target region.

At step S202, the controller 100 may select a first test bias TV1 corresponding to the first region MR1.

At step S203, the controller 100 may obtain first test data from the first region MR1 by applying, for example, simultaneously the first test bias TV1 to all the word lines of the memory block BLK. In the first test data, for example, "1" may be outputted from a string which has a string threshold voltage less than the first test bias TV1, and, for example, "0" may be outputted from a string which has a string threshold voltage greater than the first test bias TV1.

At step S204, the controller 100 may count the number of bits corresponding to a first value in the first test data. The first value may be, for example, "1." In other words, the controller 100 may count the number of strings of which string threshold voltages are less than the first test bias TV1, in the first region MR1.

At step S205, the controller 100 may calculate a first damage value based, for example, on a counted number. The first damage value may be, for example, the number of bits corresponding to "1" in the first test data or a rate of bits corresponding to "1" in the entirety of the first test data. For example, through the first damage value, the controller 100 may estimate to what extent the string threshold voltage distribution of the first region MR1 has leftward.

At step S206, the controller 100 may determine whether the first damage value exceeds a first reference value. When the first damage value exceeds the first reference value, the process may proceed to step S207. When the first damage value does not exceed the first reference value, the process may be ended. For example, since the string threshold voltage distribution of the first region MR1 has not moved leftward substantially, the controller 100 may determine that data stored in the memory block BLK is still safe.

At step S207, the controller 100 may estimate that data damage of the memory block BLK is substantial. For example, the controller 100 may estimate, based on the fast test operation for the first region MR1, that a cause of data damage of the memory block BLK is a retention issue.

Accordingly, the controller 100 may figure out data damage of the memory block BLK through the fast test operation, and may perform an appropriate recovery operation for the data damage.

Figure 12:
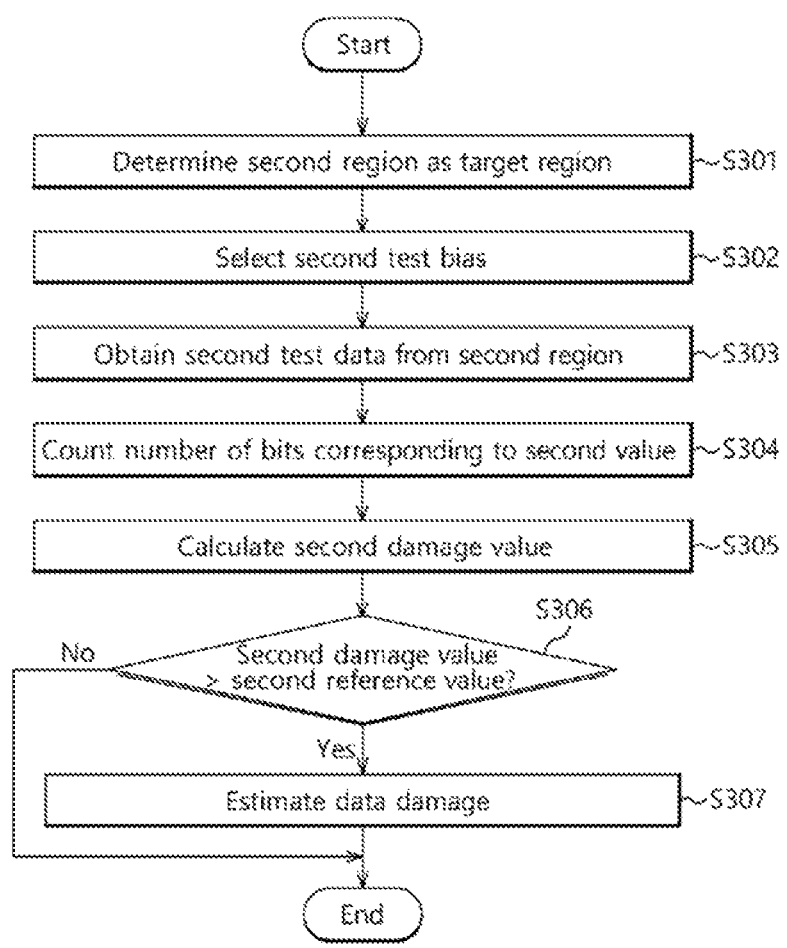

Referring to FIG. 12, there is shown a method for performing the fast test operation for the second region MR2. The method shown in FIG. 12 may be an embodiment of the step S103 of FIG. 10.

At step S301, the controller 100 may determine the second region MR2 as the target region.

At step S302, the controller 100 may select a second test bias TV2 corresponding to the second region MR2.

At step S303, the controller 100 may obtain second test data from the second region MR2 by applying, for example, simultaneously the second test bias TV2 to all the word lines of the memory block BLK. In the second test data, for example, "1" may be outputted from a string which has a string threshold voltage less than the second test bias TV2, and, for example, "0" may be outputted from a string which has a string threshold voltage greater than the second test bias TV2.

At step S304, the controller 100 may count the number of bits corresponding to a second value in the second test data. The second value may be, for example, "0." In other words, the controller 100 may count the number of strings of which string threshold voltages are greater than the second test bias TV2, in the second region MR2.

At step S305, the controller 100 may calculate a second damage value based on a counted number. The second damage value may be, for example, the number of bits corresponding to "0" in the second test data or a rate of bits corresponding to "0" in the entirety of the second test data. For example, through the second damage value, the controller 100 may estimate to what extent the string threshold voltage distribution of the second region MR2 has moved rightward.

At step S306, the controller 100 may determine whether the second damage value exceeds a second reference value. When the second damage value exceeds the second reference value, the process may proceed to step S307. When the second damage value does not exceed the second reference value, the process may be ended. For example, since the string threshold voltage distribution of the second region MR2 has not moved rightward substantially, the controller 100 may determine that data stored in the memory block BLK is still safe.

At step S307, the controller 100 may estimate that data damage of the memory block BLK is substantial.

Accordingly, the controller 100 may figure out data damage of the memory block BLK through the fast test operation, and may perform an appropriate recovery operation for the data damage.

Figure 13:
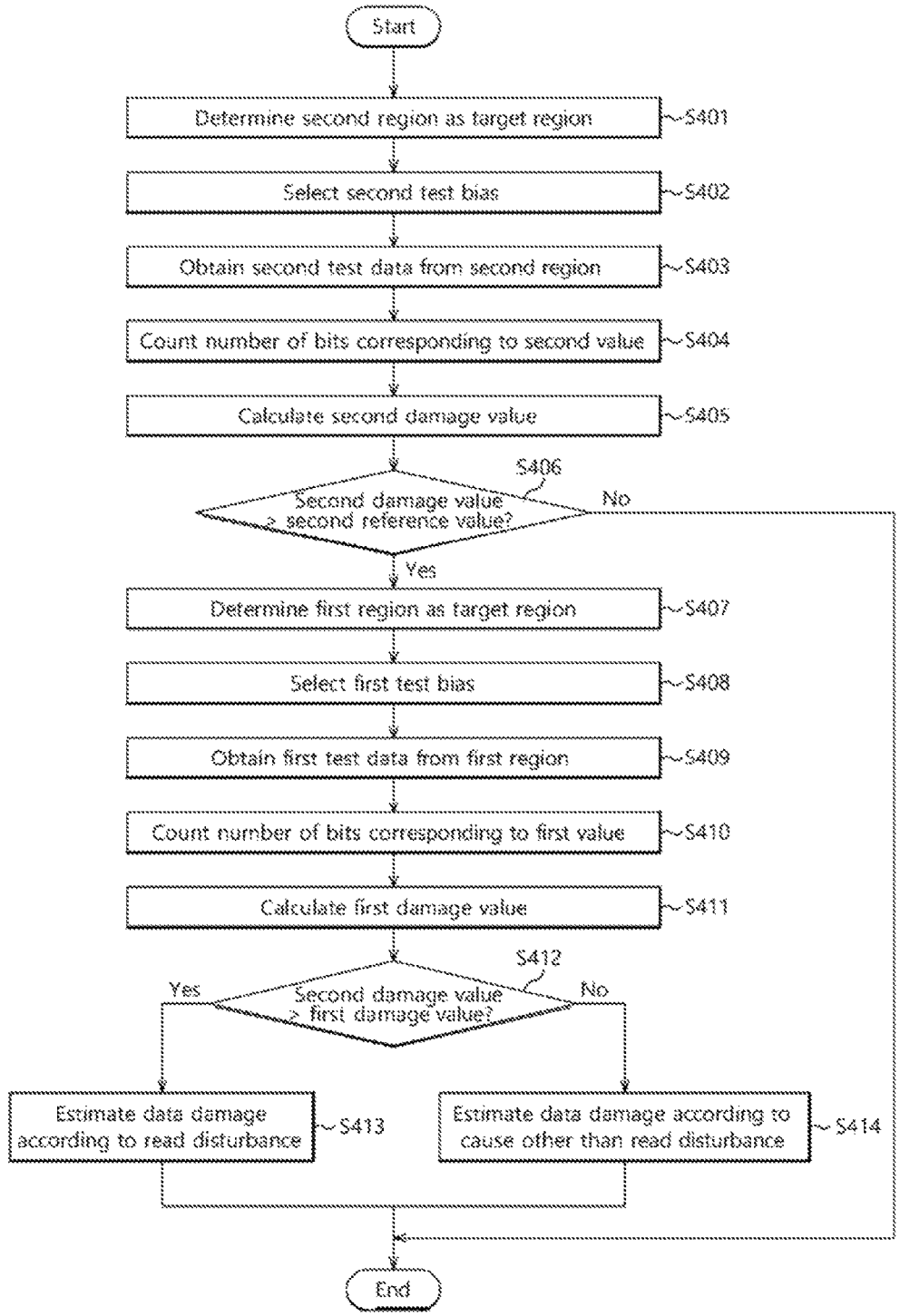

Referring to FIG. 13, there is shown a method for performing the fast test operation for the respective first and second regions MR1 and MR2. The method shown in FIG. 13 may be an embodiment of the step S104 of FIG. 10.

Steps S401 to S405 may be substantially similar to the steps S301 to S305 shown in FIG. 12. Therefore, detailed descriptions thereof are omitted herein.

At step S406, the controller 100 may determine whether the second damage value exceeds a second reference value. When the second damage value exceeds the second reference value, the process may proceed to step S407. When the second damage value does not exceed the second reference value, the process may be ended. For example, since the string threshold voltage distribution of the second region MR2 has not moved rightward substantially, the controller 100 may determine that data stored in the memory block BLK is still safe.

Steps S407 to S411 may be substantially similar to the steps S201 to S205 shown in FIG. 11. Therefore, detailed descriptions thereof are omitted herein.

At step S412, the controller 100 may determine whether the second damage value exceeds the first damage value. When the second damage value exceeds the first damage value, the process may proceed to step S413. When the second damage value does not exceed the first damage value, the process may proceed to step S414.

At the step S413, the controller 100 may estimate that data damage of the memory block BLK, according to a read disturbance influence is substantial.

At the step S414, the controller 100 may estimate that data damage of the memory block BLK according to a cause other than a read disturbance influence is substantial. For example, the controller 100 may estimate that data damage of the memory block BLK due to a retention issue is substantial.

Figure 14:
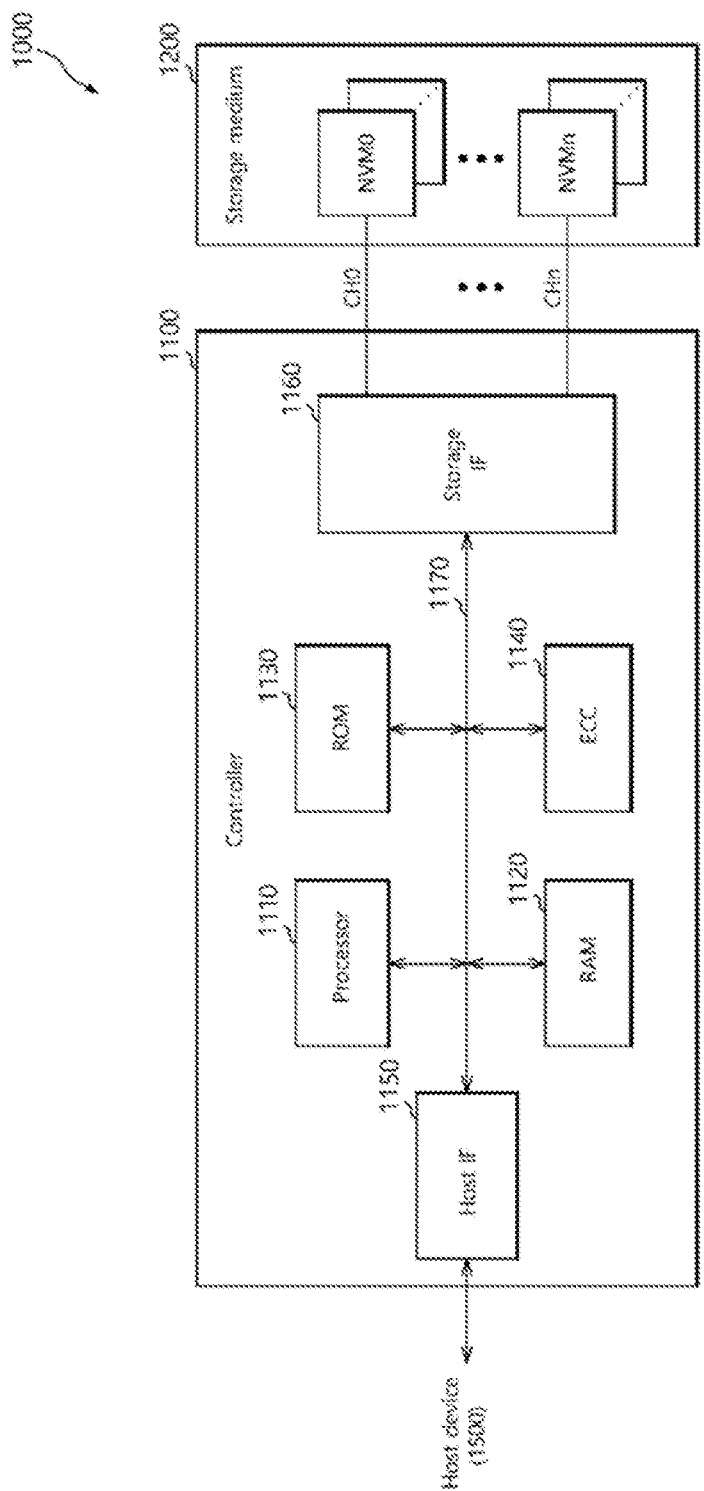
FIG. 14 is a block diagram illustrating a solid state drive (SSD), according to an embodiment of the invention.

FIG. 14 is a block diagram illustrating a solid state drive (SSD) 1000, according to an embodiment of the invention.

According to the embodiment of FIG. 14, the SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150, and a storage medium interface 1160.

The processor 1110 may control general operations of the controller 1100. For example, the processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as, for example, a merge operation, a wear leveling operation, and the like.

The processor 1110 may include the fast test unit 150 of FIG. 1. Thus, the processor 1110 may perform a fast test operation by determining a target region between first and second regions of a memory block of a nonvolatile memory device, selecting one between first and second test biases based on the target region, obtaining test data from the target region through simultaneously applying a selected test bias to all word lines of the memory block, and estimating a state of the memory block based on the test data. The processor 1110 may count the number of bits corresponding to a specified bit value in the test data, calculate a damage value based on the counted number, determine whether the damage value exceeds a reference value, and estimate a state of the memory block based on a determination result.

The RAM 1120 may store programs and program data to be used by the processor 1110. The RAM 1120 may temporarily store data transmitted from the host interface 1150 before transferring them to the storage medium 1200, and may temporarily store data transmitted from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, and the like with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to the control of the controller 1100.

Figure 15:
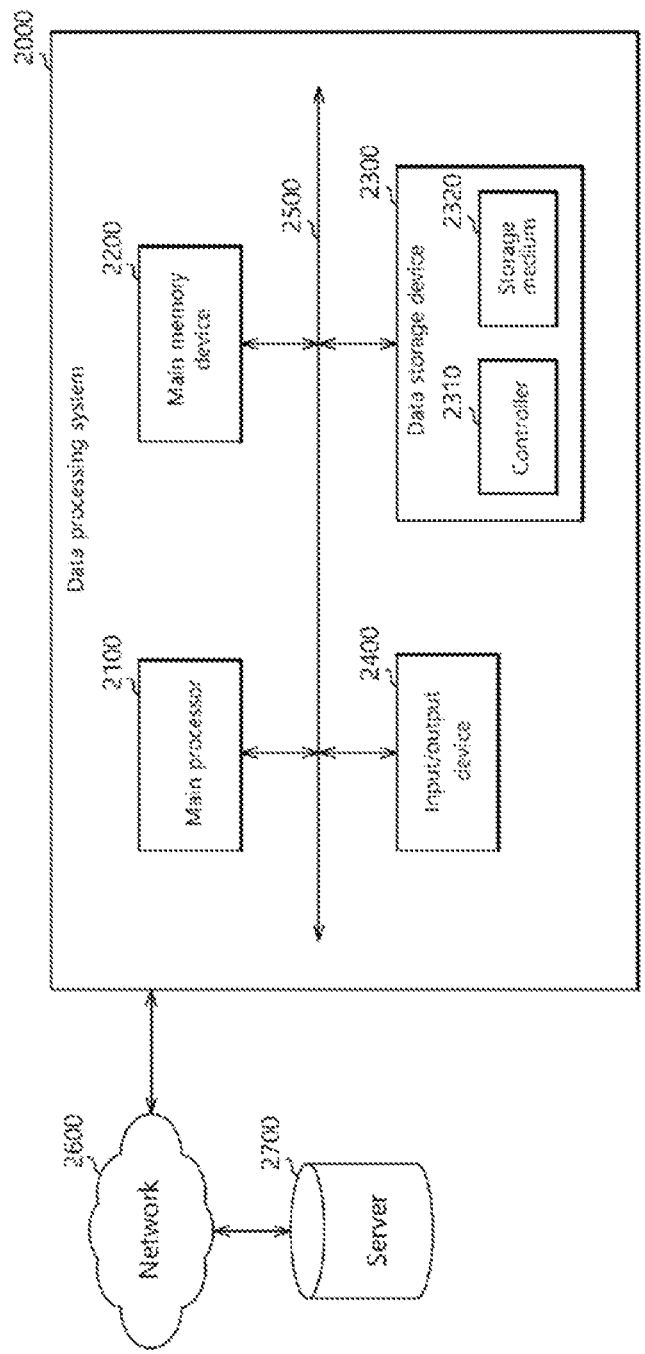
FIG. 15 is a block diagram illustrating a data processing system including a data storage device, according to an embodiment of the invention.

FIG. 15 is a block diagram illustrating a data processing system 2000 including a data storage device 10, according to an embodiment of the present invention.

According to the embodiment of FIG. 15, the data processing system 2000 may include, for example, a computer, a laptop, a netbook, a smart phone, a digital TV, a digital camera, a navigator, and the like. The data processing system 2000 may include a main processor 2100, a main memory device 2200, a data storage device 2300, and an input/output device 2400. The internal units of the data processing system 2000 may exchange data, control signals, and the like through a system bus 2500.

The main processor 2100 may control general operations of the data processing system 2000. The main processor 2100 may be, for example, a central processing unit, such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include, for example, a keyboard, a scanner, a touch screen, a screen monitor, a printer, a mouse, and the like, capable of exchanging data with a user, such as, for example, receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and/or scope of the present invention as defined in the following claims.

For example, in some instances, as would be apparent to those skilled in the relevant art elements described in connection with a particular embodiment may be used singly or in combination with other embodiments unless otherwise specifically indicated.

What is claimed is:

1. A method for operating a data storage device including a controller and a nonvolatile memory device, comprising:
   obtaining, by the controller, test data from a target region of a memory block included in the nonvolatile memory device by applying a test bias simultaneously to all word lines of the memory block in a read operation; and
   estimating, by the controller, a state of the memory block based on the test data.

2. The method according to claim 1, wherein the estimating of the state of the memory block comprises:
   determining, by the controller, a damage value based on the number of bits corresponding to a specified bit value in the test data;
   determining, by the controller, whether the damage value exceeds a reference value; and
   estimating, by the controller, the state of the memory block based on a result of the determining.

3. The method according to claim 1, wherein the target region is a region used for storing data.

4. The method according to claim 1, wherein the target region is a region not used for storing data.

5. The method according to claim 1, wherein the target region is a remaining region which is left when pages of the memory block are divided by the unit of a data chunk.

6. The method according to claim 1, wherein the obtaining of the test data comprises:
   sensing, by the nonvolatile memory device, currents of bit lines coupled to the target region when applying the test bias.

7. A method for operating a data storage device including a controller and a nonvolatile memory device, comprising:
   determining, by the controller, a target region between first and second regions of a memory block included in the nonvolatile memory device;
   selecting, by the controller, one of first and second biases based on the target region;
   obtaining, by the controller, test data from the target region by applying a selected test bias simultaneously to all word lines of the memory block in a read operation; and
   estimating, by the controller, a state of the memory block based on the test data.

8. The method according to claim 7, wherein the estimating of the state of the memory block comprises:
   determining, by the controller, a damage value based on the number of bits corresponding to a specified bit value in the test data;
   determining, by the controller, whether the damage value exceeds a reference value; and
   estimating, by the controller, the state of the memory block based on a result of the determining.

9. The method according to claim 8, wherein the estimating of the state of the memory block further comprises:
   comparing, by the controller, a first damage value determined when the first region is the target region and a second damage value determined when the second region is the target region; and
   estimating, by the controller, the state of the memory block based on a result of the comparing.

10. The method according to claim 8, wherein the specified bit value includes a first value when the first region is the target region and includes a second value when the second region is the target region.

11. The method according to claim 7,
   wherein the first region is a region used for storing data, and
   wherein the second region is a region not used for storing data.

12. The method according to claim 11,
   wherein the selecting of the one comprises:
   selecting, by the controller, the first test bias when the first region is the target region and selecting the second test bias when the second region is the target region, and
   wherein the first test bias is greater than the second test bias.

13. The method according to claim 7, wherein the determining of the target region comprises:
   determining, by the controller, whether at least one of a plurality of trigger conditions is satisfied; and
   determining, by the controller, the target region based on a satisfied trigger condition.

14. A method for operating a data storage device including a controller and a nonvolatile memory device, comprising:
   comparing threshold voltages of respective strings included in a target region of a memory block included in the nonvolatile memory device, based on test data obtained by applying a test bias simultaneously to the plurality of word lines in a read operation, each of the strings including a plurality of memory cells which are coupled to a plurality of word lines; and
   estimating a state of the memory block based on a comparison result.

15. The method according to claim 14, wherein the comparing comprises:
   comparing, by the controller, the threshold voltages with the test bias, based on the test data.

16. The method according to claim 14, wherein the estimating of the state of the memory block comprises:
   determining, by the controller, the number of strings of which threshold voltages are in a predetermined direction from the test bias, based on the comparison result;
   determining, by the controller, a damage value based on the number of strings;
   determining, by the controller, whether the damage value exceeds a reference value; and estimating, by the controller, the state of the memory block based on a result of the determining whether the damage value exceeds the reference value.

17. The method according to claim 16,
wherein the predetermined direction is determined according to whether the target region is a first region or a second region of the memory block,
wherein the first region is a region used for storing data, and
wherein the second region is a region not used for storing data.

18. The method according to claim 17, wherein the predetermined direction is a low direction when the first region is the target region and is a high direction when the second region is the target region.

19. The method according to claim 17,
wherein the test bias includes first and second test biases, is the first test bias when the first region is the target region, and is the second test bias when the second region is the target region, and
wherein the first test bias is greater than the second test bias.

20. The method according to claim 17, wherein the estimating of the state of the memory block comprises:
comparing, by the controller, a first damage value determined when the first region is the target region and a second damage value determined when the second region is the target region; and
estimating, by the controller, the state of the memory block based on a result of the comparing.

* * * * *